United States Patent
Dao et al.

(10) Patent No.: US 12,424,600 B1
(45) Date of Patent: Sep. 23, 2025

(54) TILED DISPLAY SYSTEM FOR FIELD OF VIEW EXPANSION

(71) Applicant: Meta Platforms Technologies, LLC, Menlo Park, CA (US)

(72) Inventors: Kevin Dao, San Jose, CA (US); Yun Wang, Bellevue, WA (US); Fenglin Peng, Redmond, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 506 days.

(21) Appl. No.: 18/053,227

(22) Filed: Nov. 7, 2022

(51) Int. Cl.
| | |
|---|---|
| *H01L 25/16* | (2023.01) |
| *G02B 27/01* | (2006.01) |
| *G02F 1/1333* | (2006.01) |
| *G06F 3/01* | (2006.01) |

(52) U.S. Cl.
CPC .......... *H01L 25/167* (2013.01); *G02B 27/017* (2013.01); *H01L 25/165* (2013.01); *G02F 1/133302* (2021.01); *G06F 3/013* (2013.01)

(58) Field of Classification Search
CPC ... H01L 25/167; H01L 25/165; G02B 27/017; G02F 1/133302; G06F 3/013
See application file for complete search history.

(56) References Cited

U.S. PATENT DOCUMENTS

| | | |
|---|---|---|
| 7,495,638 B2 | 2/2009 | Lamvik et al. |
| 9,368,070 B2* | 6/2016 | Jepsen .................. G09G 5/377 |
| 9,590,025 B2 | 3/2017 | Yu et al. |
| 9,899,456 B2* | 2/2018 | Ghosh ................... H10K 59/18 |
| 10,054,797 B2 | 8/2018 | Spitzer |
| 10,446,585 B2 | 10/2019 | Harris et al. |
| 10,678,048 B1 | 6/2020 | Wheelwright et al. |
| 10,784,241 B2 | 9/2020 | Chang et al. |
| 10,914,956 B1 | 2/2021 | Trail et al. |
| 11,009,944 B1* | 5/2021 | Choi ..................... G09G 3/3275 |
| 11,016,302 B2 | 5/2021 | Freeman et al. |
| 11,158,690 B1* | 10/2021 | Choi ................... G02B 27/0172 |
| 11,374,053 B2 | 6/2022 | Garner et al. |
| 2016/0014882 A1 | 1/2016 | Jongman et al. |
| 2021/0013265 A1* | 1/2021 | Hinata .................. H10K 59/38 |
| 2021/0134231 A1* | 5/2021 | Soda .................... G09G 3/3233 |
| 2021/0167133 A1* | 6/2021 | Nakata .................. H04N 23/65 |
| 2022/0130925 A1* | 4/2022 | Takahashi ................ F21V 9/00 |

* cited by examiner

*Primary Examiner* — Kevin Quarterman
(74) *Attorney, Agent, or Firm* — Greenberg Traurig, LLP

(57) ABSTRACT

A display panel of a near-eye display system includes a first substrate having a first region and a second region adjacent to the first region; a first active region on the first region of the first substrate and characterized by a first display resolution; a silicon backplane bonded on the second region of the first substrate; and a second active region on the silicon backplane, the second active region characterized by a second display resolution higher than the first display resolution.

20 Claims, 13 Drawing Sheets

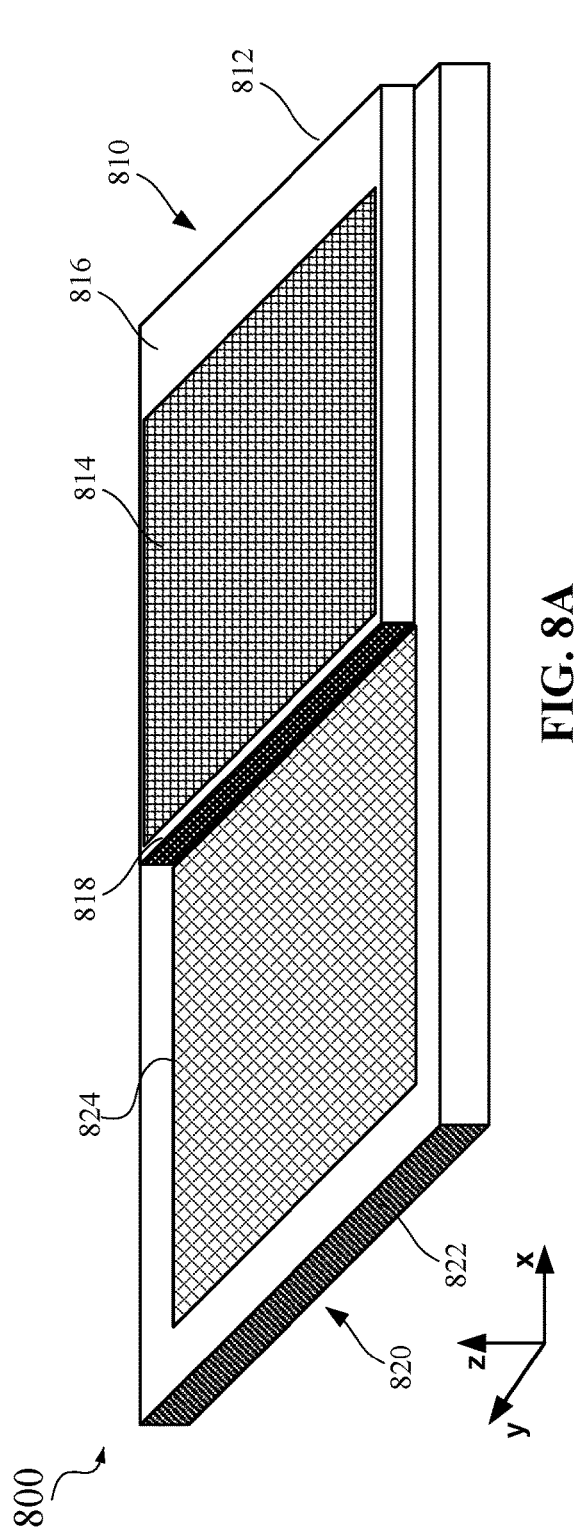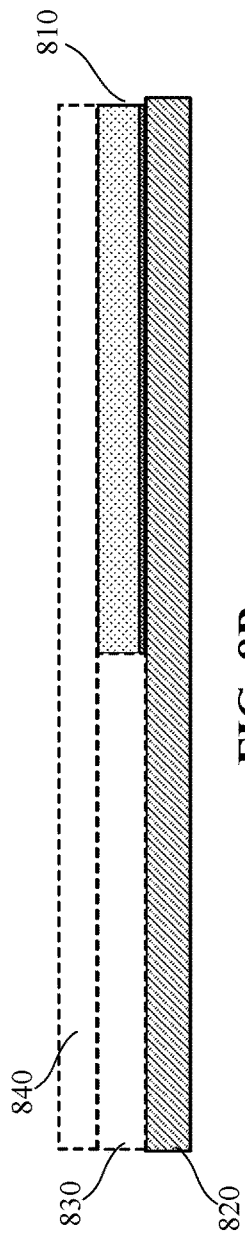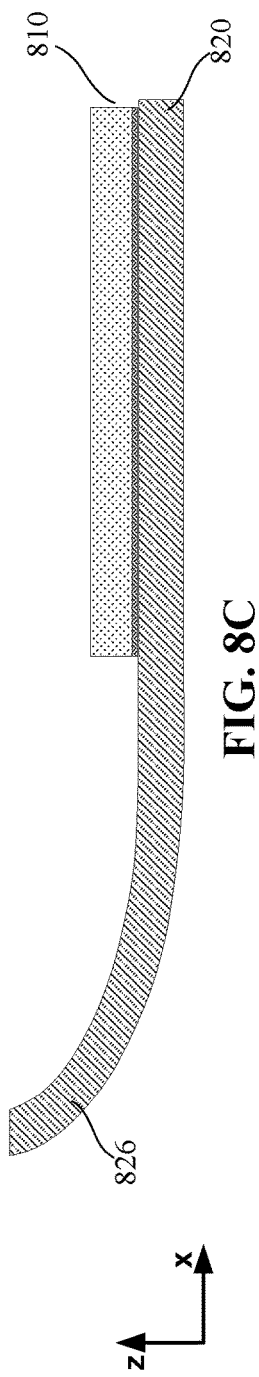
FIG. 8A
FIG. 8B
FIG. 8C

TILED DISPLAY SYSTEM FOR FIELD OF VIEW EXPANSION

BACKGROUND

An artificial reality system, such as a head-mounted display (HMD) or heads-up display (HUD) system, generally includes a near-eye display system in the form of a headset or a pair of glasses and configured to present content to a user via an electronic or optic display within, for example, about 10-20 mm in front of the user's eyes. The near-eye display system may display virtual objects or combine images of real objects with virtual objects, as in virtual reality (VR), augmented reality (AR), or mixed reality (MR) applications. For example, in an AR system, a user may view both images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through).

A near-eye display generally includes an optical system configured to form an image of a computer-generated image on an image plane. The optical system of the near-eye display may relay the image generated by an image source (e.g., a display panel) to create a virtual image that appears to be away from the image source and further than just a few centimeters away from the user's eyes. For example, the optical system may collimate the light from the image source or otherwise convert spatial information of the displayed virtual objects into angular information to create a virtual image that may appear to be far away. The optical system may also magnify the image source to make the image appear larger than the actual size of the image source. It is generally desirable that the optical system of a near-eye display has a small size, a low weight, a large field of view, a large eye box, a high efficiency, and a low cost.

SUMMARY

This disclosure relates generally to near-eye display. More specifically, and without limitation, techniques disclosed herein relate to near-eye display systems including tiled display panels for increased field of view. Various inventive embodiments are described herein, including devices, systems, methods, structures, materials, processes, and the like.

According to certain embodiments, a display panel may include a first substrate including a first region and a second region adjacent to the first region, a first active region on the first region of the first substrate and characterized by a first display resolution, a silicon backplane bonded on the second region of the first substrate, and a second active region on the silicon backplane, the second active region characterized by a second display resolution higher than the first display resolution.

In some embodiments of the display panel, the first substrate may include a rigid substrate, which may include, for example, a metal oxide or a semiconductor oxide. In some embodiments, the first substrate may include a flexible organic substrate and may be curved at least at the first region, and the first active region may also be curved to further increase a field of view of the display panel. In some embodiments, the gap between the first active region and the second active region may be less than about 1 mm. In some embodiments, a total monocular field of view of the display panel may be greater than about 150°.

In some embodiments of the display panel, the first active region may include an active matrix organic light-emitting diode (AMOLED) display panel or a liquid crystal display (LCD) panel. In some embodiments, the display panel may include a thin-film transistor (TFT) layer between the first substrate and the first active region. In some embodiments, the display panel may include drive circuits for the first active region formed on the second region of the first substrate and between the silicon backplane and the first substrate. In some embodiments, the display panel may include a cover glass on the first active region, the cover glass having a thickness matching a total thickness of the silicon backplane and the second active region.

In some embodiments of the display panel, the second active region may include a two-dimensional array of micro-light emitting diodes (micro-LEDs) or a two-dimensional array of micro organic light emitting diodes (μOLEDs). In some embodiments, the second display resolution may be equal to or greater than about 4 K pixels per inch. In some embodiments, the silicon backplane may include complementary metal-oxide-semiconductor (CMOS) pixel drive circuits for the second active region, and the pixel drive circuits may be characterized by a pitch less than about 50 μm.

In some embodiments of the display panel, a region of the second active region adjacent to the first active region may include macro-pixels, each macro-pixel including a group of pixels that are configured to receive the same display data. In some embodiments, a number of pixels in each macro-pixel may gradually increase as a distance between the macro-pixel and the first active region decreases.

In some embodiments, the display panel may also include a plurality of eye-tracking devices formed on or in edge regions of the first substrate that are outside of the first region and the second region. The plurality of eye-tracking devices may include, for example, infrared light emitters, infrared sensors, or both infrared light emitters and infrared sensors.

According to certain embodiments, a near-eye display system may include a display panel and display optics configured to project images displayed by the display panel to an eye of a user. The display panel may include a first substrate including a first region and a second region adjacent to the first region, a first active region on the first region of the first substrate and characterized by a first display resolution, a silicon backplane bonded on the second region of the first substrate, and a second active region on the silicon backplane, the second active region characterized by a second display resolution greater than the first display resolution. In some embodiments, the display optics include a C-shaped pancake lens. In some embodiments, a monocular field of view of the near-eye display system may be greater than about 150°.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

FIG. 8A is a perspective view of an example of a tiled display system according to certain embodiments.

FIG. 8B is a cross-sectional view of an example of a tiled display system according to certain embodiments.

FIG. 8C is a cross-sectional view of another example of a tiled display system according to certain embodiments.

Figure 1:
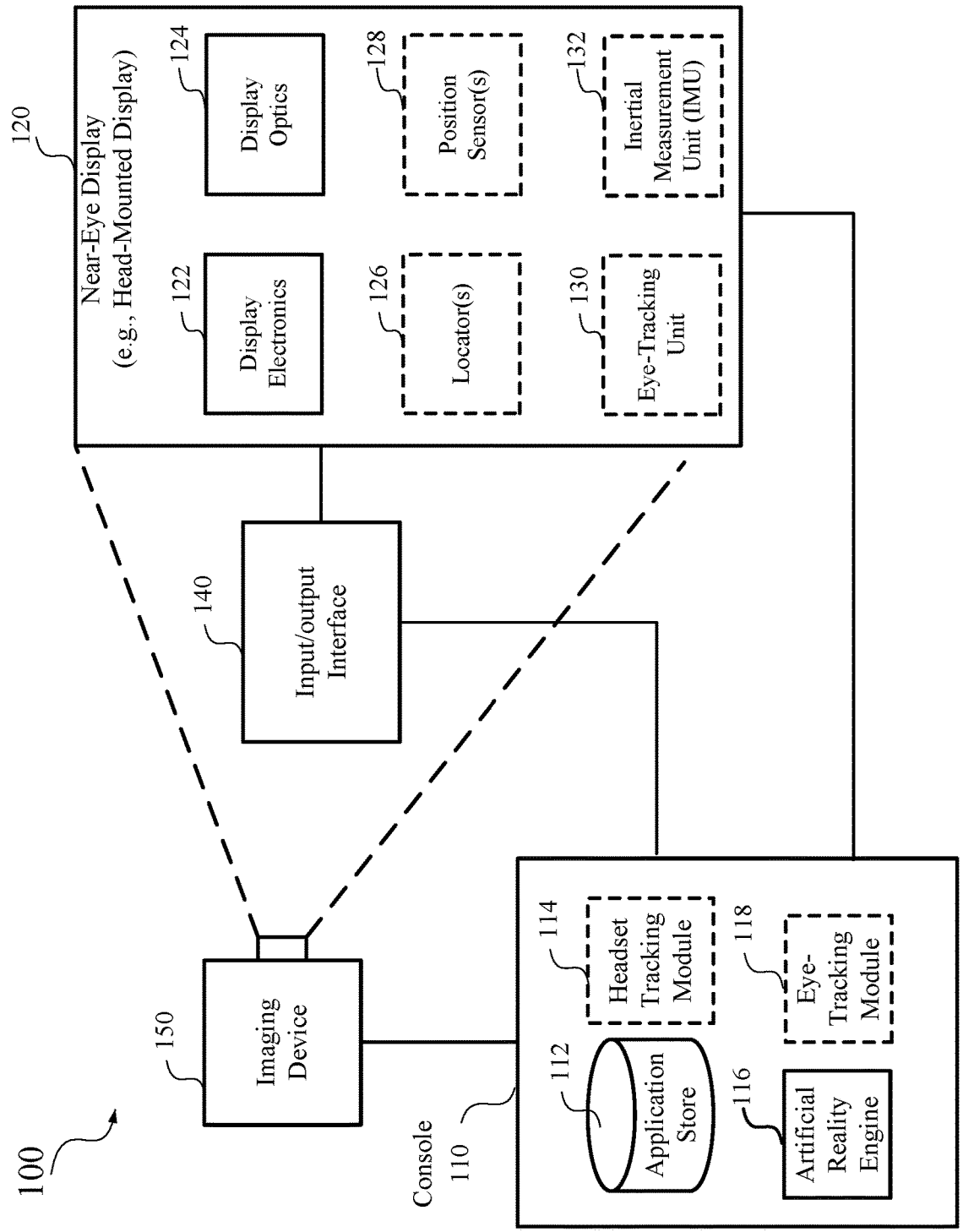
FIG. 1 is a simplified block diagram of an example of an artificial reality system environment including a near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to near-eye display. More specifically, and without limitation, techniques disclosed herein relate to near-eye display systems including tiled display panels for increased field of view (FOV). Various inventive embodiments are described herein, including devices, systems, methods, structures, materials, processes, and the like. Augmented reality (AR) and virtual reality (VR) applications may use near-eye displays (e.g., head-mounted displays) to present images to users. A near-eye display system may include an image source (e.g., a display panel) for generating image frames, and display optics for projecting the image frames to the user's eyes. It is generally desirable that the near-eye display system has a large FOV and a higher resolution in order to, for example, improve the immersive experience of using the near-eye display system. The FOV of a display system is the angular range over which an image may be projected in the near or far field. The FOV of a display system is generally measured in degrees, and the resolution over the FOV is generally measured in pixels per degree (PPD). The FOV of a display system may be linearly proportional to the size of the image source (e.g., the display panel), and may be inversely proportional to the focal length of the display optics (e.g., a collimation lens or lens assembly). A balance between the size of the image source and the optical power of the display optics may be needed in order to achieve a good modulation transfer function (MTF) and reduced size/weight/cost. The field of view may be increased by bringing the image source closer, but the image source would need to have higher PPD, and the aberrations of the display optics at the periphery may limit the effective field of view. In addition, to achieve a high PPD, micro displays with ultra-high pixels per inch (PPI) may be needed. There may be many technological challenges and cost issues associated with making high-PPI display panels (e.g., silicon-based OLED panels or micro-LED panels) with large sizes to cover wider FOVs. For example, micro displays may generally be small by design due to the uses of silicon backplanes that may have limited sizes and/or high cost for large sizes. As such, the FOVs of current AR/VR/MR systems may be limited, which may adversely affect the user experience.

Tiled displays that use two discrete display systems may be used to improve the FOV, where a central display system for the central FOV and a peripheral display system for the peripheral FOV may be placed, for example, side by side. However, tiled displays with discrete display systems may have many issues. One notable issue is the boundary between the central display system and the peripheral display system. For example, mechanical structures such as lens housing and eye-tracking assembly housing may create physical boundary between the discrete display systems of the tiled displays. In addition, the boundary between discrete display systems with mismatching resolutions can result in abrupt transitions across a displayed image.

According to certain embodiments, an integrated, tiled display system may include a peripheral display panel with a lower resolution on a first region of a large base substrate, and may also include a higher resolution central display panel bonded on top of a second region of the large base substrate that is adjacent to the first region. The large base substrate may include a rigid or flexible substrate, such as a glass or another oxide substrate, or an organic substrate, such as a polyimide substrate. The peripheral display panel may include, for example, a lower resolution panel (e.g., with PPI≤1K) that does not need to use a silicon backplane to drive. For example, the peripheral display panel may be controlled using thin-film transistor (TFT) drive circuits formed on the first region of the large base substrate. The lower resolution peripheral display panel may include, for example, an active matrix organic light-emitting diode (AMOLED) display panel or a liquid crystal display (LCD) panel. The central display panel may have a higher resolution (e.g., with PPI ≥4K or 5K), and may include, for example, micro-LEDs or μOLEDs with silicon-based backplane drive circuits. Thus, the tiled display system can have a higher resolution at least in the center (or foveated) region, and may also have a wider FOV provided by the combination of the central display panel and the peripheral display panel. For example, the monocular FOV of the tiled display system can be greater than 135°, 150°, 170° or wider, and the binocular FOV of a near-eye display including the tiled display system may be greater than abut 150°, 180°, 200°, 220°, or wider.

The central display panel with the higher resolution may have a small non-active edge region adjacent to the peripheral display panel. The small non-active edge region of the central display panel may be on top of and overlap with a non-active edge region of the peripheral display panel. Drive circuit of the peripheral display panel can be underneath the central display panel. Therefore, the non-active region between the two display panels of the tiled display system can be very small (e.g., less than 2 mm, 1 mm, 0.5 mm or smaller), such that the tiled display system may include a substantially continuous display panel with a higher resolution central region and a lower resolution peripheral region.

In some embodiments, at least the peripheral region of the base substrate and the lower resolution display panel formed thereon can be curved to further increase the FOV (e.g., greater than 180°, such as about) 200°-240°. Foveated rending may be utilized to create a smooth transition between the higher resolution central region and the lower resolution peripheral region. For example, in the boundary regions of the central display panel with the higher resolution, pixels in the central display panel may be grouped to form macro-pixels to gradually decrease the effective resolution from the higher resolution to the low resolution of the peripheral display panel. The display optics can include a single freeform (e.g., C-shaped) lens or dual lenses (e.g., one for each panel) optimized for both the central display panel and the peripheral display panel.

The tiled display systems described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through).

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive.

The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140, each of which may be coupled to an optional console 110. While FIG. 1 shows an example of artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audio, or any combination thereof. In some embodiments, audio may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of eye-tracking unit 130, locators 126, position sensors 128, and IMU 132, or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (μLED) display, an active-matrix OLED display (AMO-LED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or any combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be an LED, a corner cube reflector, a reflective marker, a type of light source that contrasts with an environment in which near-eye display 120 operates, or any combination thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

External imaging device 150 may include one or more cameras, one or more video cameras, any other device capable of capturing images including one or more of locators 126, or any combination thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or any combination thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or any combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or any combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140. In some embodiments, external imaging device 150 may be used to track input/output interface 140, such as tracking the location or position of a controller (which may include, for example, an IR light source) or a hand of the user to determine the motion of the user. In some embodiments, near-eye display 120 may include one or more imaging devices to track input/output interface 140, such as tracking the location or position of a controller or a hand of the user to determine the motion of the user.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and an eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or any combination thereof, to predict a future location of near-eye display 120. Headset tracking module 114 may provide the estimated or predicted future position of near-eye display 120 to artificial reality engine 116.

Artificial reality engine 116 may execute applications within artificial reality system environment 100 and receive position information of near-eye display 120, acceleration information of near-eye display 120, velocity information of near-eye display 120, predicted future positions of near-eye display 120, or any combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to determine the eye's orientation more accurately.

Figure 2:
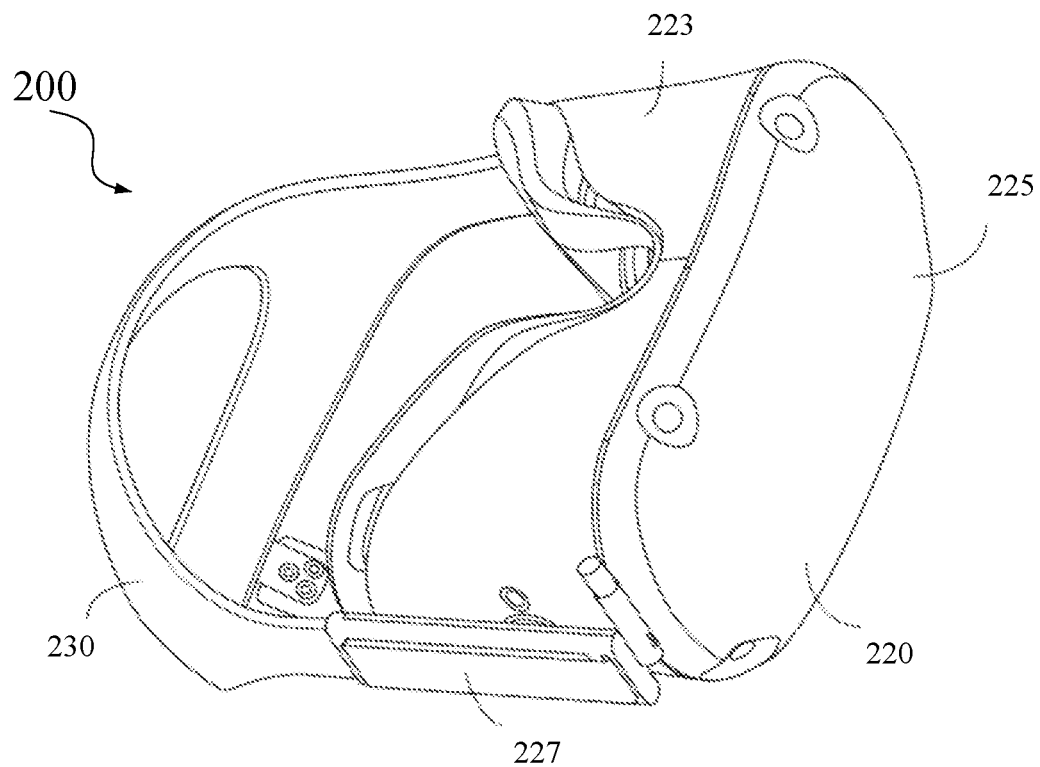
FIG. 2 is a perspective view of an example of a near-eye display in the form of a head-mounted display (HMD) device for implementing some of the examples disclosed herein.

FIG. 2 is a perspective view of an example of a near-eye display in the form of an HMD device 200 for implementing some of the examples disclosed herein. HMD device 200 may be a part of, e.g., a VR system, an AR system, an MR system, or any combination thereof. HMD device 200 may include a body 220 and a head strap 230. FIG. 2 shows a bottom side 223, a front side 225, and a left side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temple tips as shown in, for example, FIG. 3 below, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audio, or any combination thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a μLED display, an AMO-LED, a TOLED, some other display, or any combination thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or any combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
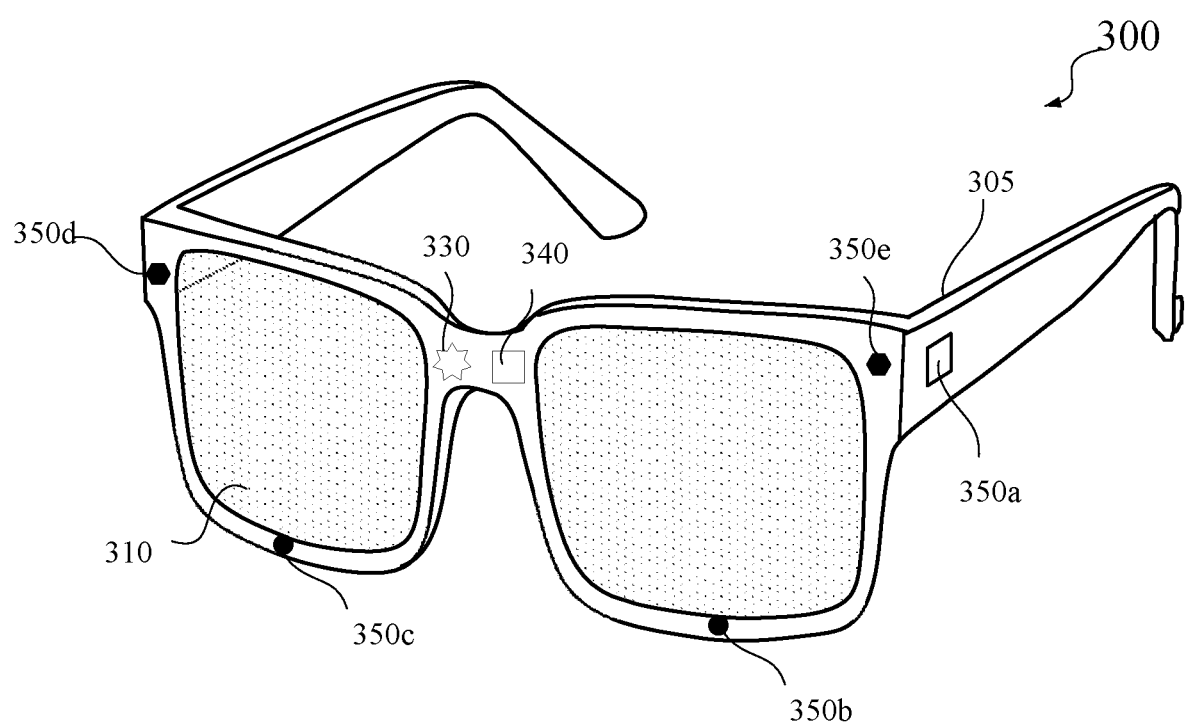
FIG. 3 is a perspective view of an example of a near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350a, 350b, 350c, 350d, and 350e on or within frame 305. In some embodiments, sensors 350a-350e may include one or more depth sensors, motion sensors, position sensors, inertial sensors, or ambient light sensors. In some embodiments, sensors 350a-350e may include one or more image sensors configured to generate image data representing different fields of views in different directions. In some embodiments, sensors 350a-350e may be used as input devices to control or influence the displayed content of near-eye display 300, and/or to provide an interactive VR/AR/MR experience to a user of near-eye display 300. In some embodiments, sensors 350a-350e may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350a-350e in capturing images of different objects within the dark environment. In some embodiments, illuminator(s) 330 may be used to project certain light patterns onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

Figure 4:
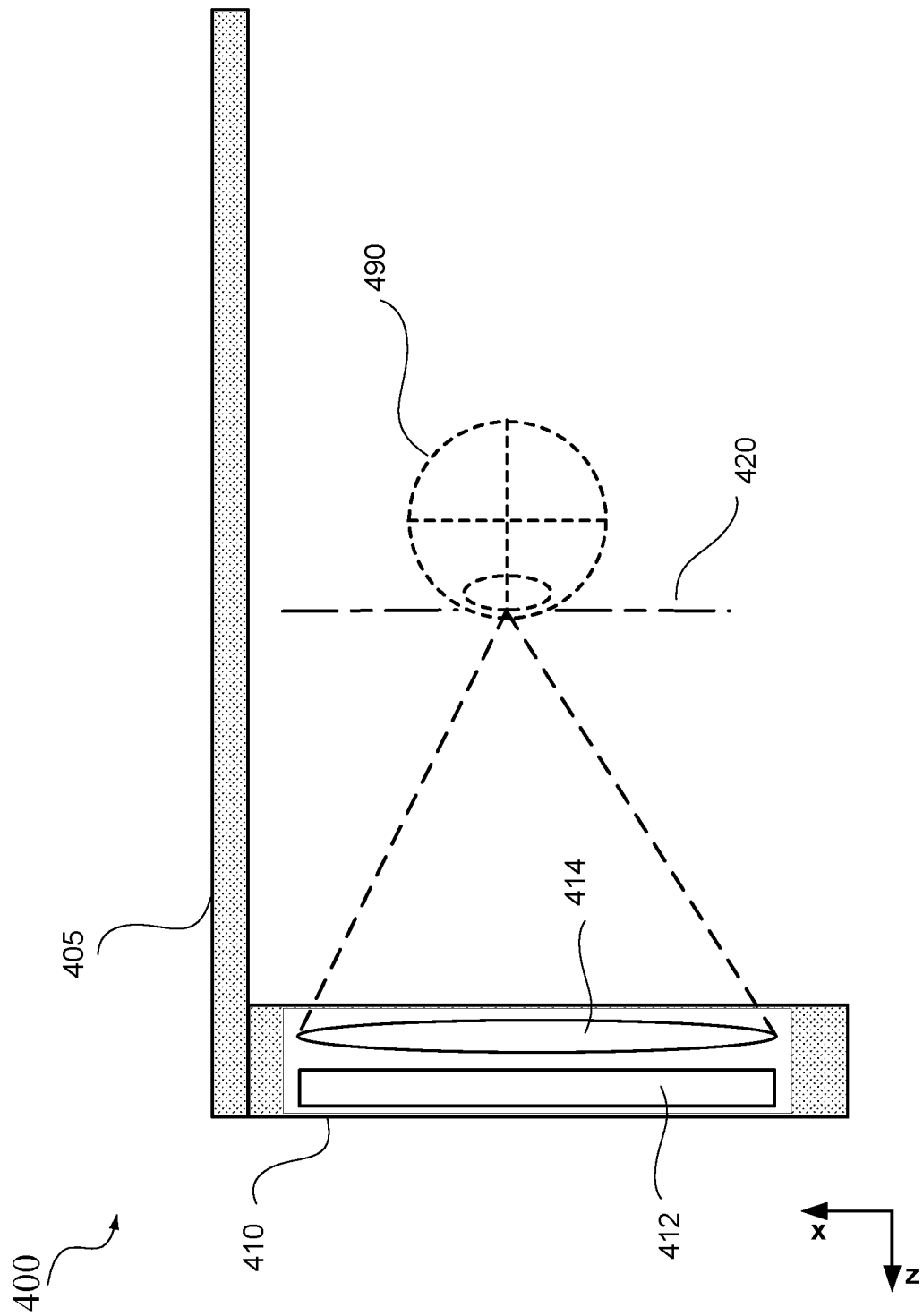
FIG. 4 is a cross-sectional view of an example of a near-eye display according to certain embodiments.

FIG. 4 is a cross-sectional view of an example of a near-eye display 400 according to certain embodiments. Near-eye display 400 may include at least one display assembly 410. Display assembly 410 may be configured to direct image light (e.g., display light) to an eyebox located at an exit pupil 420 and to user's eye 490. It is noted that, even though FIG. 4 and other figures in the present disclosure show an eye of a user of the near-eye display for illustration purposes, the eye of the user is not a part of the corresponding near-eye display.

As HMD device 200 and near-eye display 300, near-eye display 400 may include a frame 405 and display assembly 410 that may include a display 412 and/or display optics 414 coupled to or embedded in frame 405. As described above, display 412 may display images to the user electrically (e.g., using LCDs, LEDs, OLEDs) or optically (e.g., using a waveguide display and optical couplers) according to data received from a processing unit, such as console 110. In some embodiments, display 412 may include a display panel that includes pixels made of LCDs, LEDs, OLEDs, and the like. Display 412 may include sub-pixels to emit light of a predominant color, such as red, green, blue, white, or yellow. In some embodiments, display assembly 410 may include a stack of one or more waveguide displays including, but not restricted to, a stacked waveguide display, a varifocal waveguide display, and the like. The stacked waveguide display may be a polychromatic display (e.g., a red-green-blue (RGB) display) created by stacking waveguide displays whose respective monochromatic sources are of different colors.

Display optics 414 may be similar to display optics 124 and may display image content optically (e.g., using optical waveguides and optical couplers), correct optical errors associated with the image light, combine images of virtual objects and real objects, and present the corrected image light to exit pupil 420 of near-eye display 400, where the user's eye 490 may be located. In some embodiments, display optics 414 may also relay the images to create virtual images that appear to be away from display 412 and further than just a few centimeters away from the eyes of the user. For example, display optics 414 may collimate the image source to create a virtual image that may appear to be far away (e.g., greater than about 0.3 m, such as about 0.5 m, 1 m, or 3 m away) and convert spatial information of the displayed virtual objects into angular information. In some embodiments, display optics 414 may also magnify the source image to make the image appear larger than the actual size of the source image. More details of display 412 and display optics 414 are described below.

In various implementations, the optical system of a near-eye display, such as an HMD, may be pupil-forming or non-pupil-forming. Non-pupil-forming HMDs may not use intermediary optics to relay the displayed image, and thus the user's pupils may serve as the pupils of the HMD. Such non-pupil-forming displays may be variations of a magnifier (sometimes referred to as "simple eyepiece"), which may magnify a displayed image to form a virtual image at a greater distance from the eye. The non-pupil-forming display may use fewer optical elements. Pupil-forming HMDs may use optics similar to, for example, optics of a compound microscope or telescope, and may include some forms of projection optics that magnify an image and relay it to the exit pupil.

Figure 5:
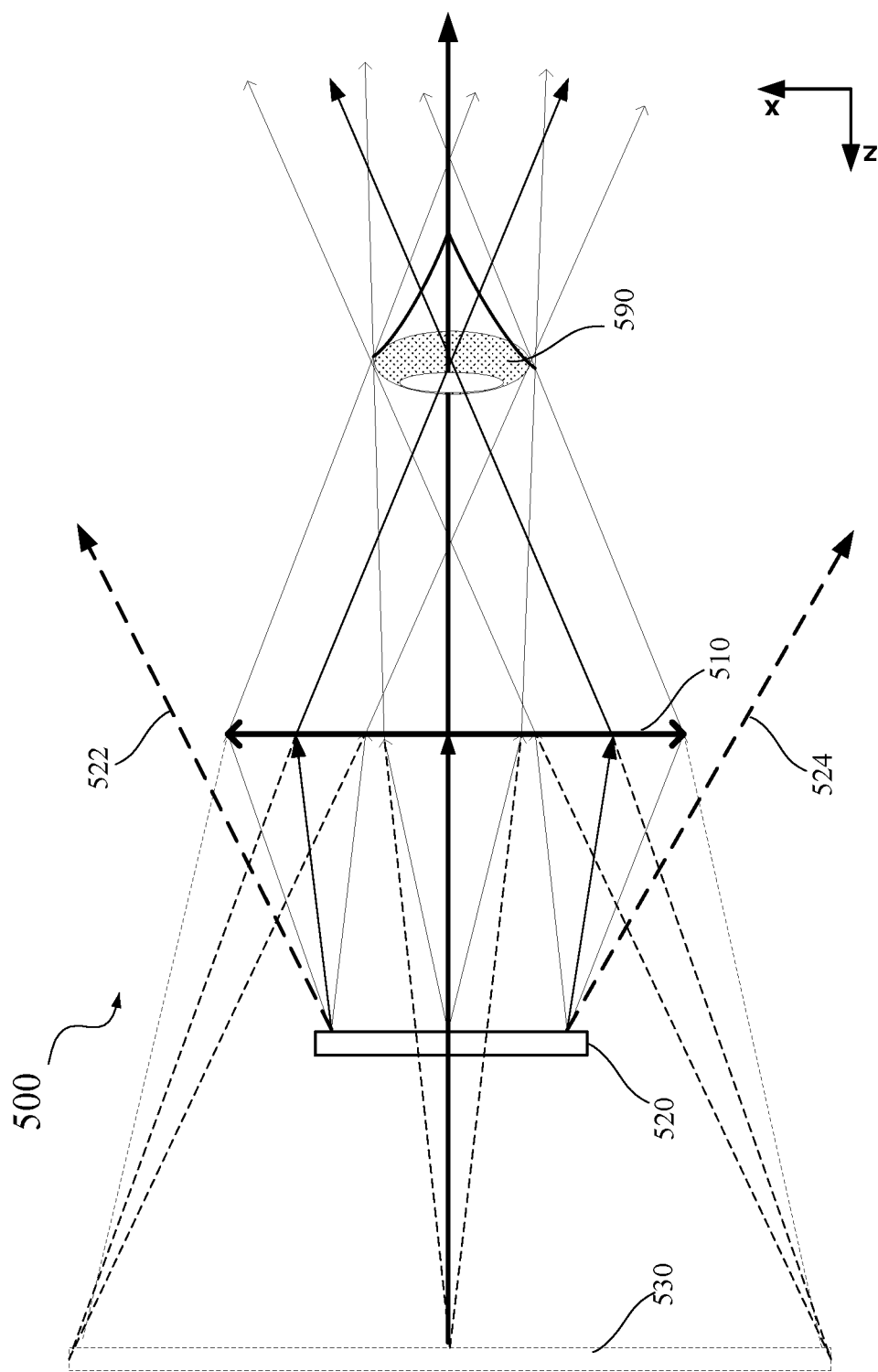
FIG. 5 illustrates an example of an optical system with a non-pupil forming configuration for a near-eye display device according to certain embodiments.

FIG. 5 illustrates an example of an optical system 500 with a non-pupil forming configuration for a near-eye display device according to certain embodiments. Optical system 500 may be an example of near-eye display 400, and may include display optics 510 and an image source 520 (e.g., a display panel). Display optics 510 may function as a magnifier. FIG. 5 shows that image source 520 is in front of display optics 510. In some other embodiments, image source 520 may be located outside of the field of view of the user's eye 590. For example, one or more deflectors or directional couplers may be used to deflect light from an image source to make the image source appear to be at the location of image source 520 shown in FIG. 5. Image source 520 may be an example of display 412 described above. For example, image source 520 may include a two-dimensional array of light emitters, such as semiconductor micro-LEDs or micro-OLEDs. The dimensions and pitches of the light emitters in image source 520 may be small. For example, each light emitter may have a diameter less than 2 μm (e.g., about 1.2 μm) and the pitch may be less than 2 μm (e.g., about 1.5 μm). As such, the number of light emitters in image source 520 can be equal to or greater than the number of pixels in a display image, such as 960×720, 1280×720, 1440×1080, 1920×1080, 2160×1080, or 2560×1080 pixels. Thus, a display image may be generated simultaneously by image source 520.

Light from an area (e.g., a pixel or a light emitter) of image source 520 may be directed to a user's eye 590 by display optics 510. Light directed by display optics 510 may form virtual images on an image plane 530. The location of image plane 530 may be determined based on the location of image source 520 and the focal length of display optics 510. A user's eye 590 may form a real image on the retina of user's eye 590 using light directed by display optics 510. In this way, objects at different spatial locations on image source 520 may appear to be objects on an image plane far away from user's eye 590 at different viewing angles. Image source 520 may have a size larger or smaller than the size (e.g., aperture) of display optics 510. Some light emitted from image source 520 with large emission angles (as shown by light rays 522 and 524) may not be collected and directed to user's eye 590 by display optics 510, and may become stray light.

Figure 6:
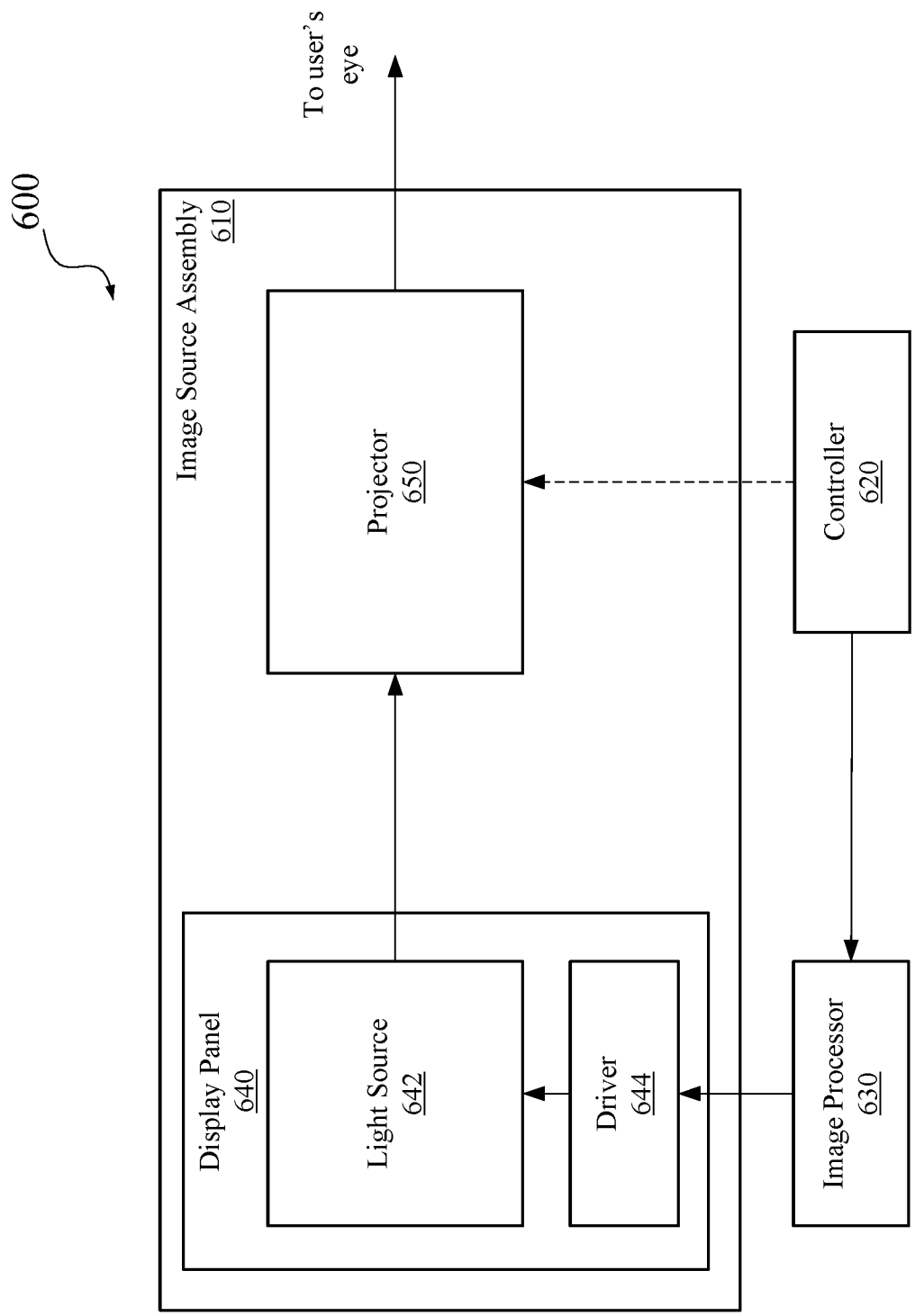
FIG. 6 illustrates an example of an image source assembly in a near-eye system according to certain embodiments.

FIG. 6 illustrates an example of an image source assembly 610 in a near-eye display system 600 according to certain embodiments. Image source assembly 610 may include, for example, a display panel 640 that may generate display images to be projected to a user's eyes, and a projector 650 that may project the display images generated by display panel 640 to the user's eye. Display panel 640 may include a light source 642 and a drive circuit 644 for controlling light source 642. Light source 642 may include, for example, LEDs, OLEDs, micro-LEDs, resonant cavity light emitting diodes (RC-LEDs), or other light emitters. Projector 650 may include, for example, a diffractive optical element, a freeform optical element, a scanning mirror, and/or other display optics, such as display optics 414 or 510 described above. In some embodiments, near-eye display system 600 may also include a controller 620 that synchronously controls light source 642 and projector 650 (e.g., including a scanner). Image source assembly 610 may generate and output an image to user's eyes.

Light source 642 may include a plurality of light emitters arranged in an array or a matrix. Each light emitter may emit monochromatic light, such as red light, blue light, green light, infra-red light, and the like. While RGB colors are often used, embodiments described herein are not limited to using red, green, and blue as primary colors. Other colors can also be used as the primary colors of near-eye display system 600. In some embodiments, a display panel in accordance with an embodiment may use more than three primary colors. Each pixel in light source 642 may include three subpixels that include a red LED, a green LED, and a blue LED. A semiconductor LED generally includes an active light emitting layer within multiple layers of semiconductor materials. The multiple layers of semiconductor materials may include different compound materials or a same base material with different dopants and/or different doping densities. For example, the multiple layers of semiconductor materials may include an n-type material layer, an active region that may include hetero-structures (e.g., one or more quantum wells), and a p-type material layer.

Controller 620 may control the image rendering operations of image source assembly 610, such as the operations of light source 642 and/or projector 650. For example, controller 620 may determine instructions for image source assembly 610 to render one or more display images. The instructions may include display instructions and/or scanning instructions. In some embodiments, the display instructions may include an image file (e.g., a bitmap file). The display instructions may be received from, for example, a console, such as console 110 described above with respect to FIG. 1. Controller 620 may include a combination of hardware, software, and/or firmware not shown here so as not to obscure other aspects of the present disclosure. In some embodiments, controller 620 may be a graphics processing unit (GPU) of a display device. In other embodiments, controller 620 may be other kinds of processors.

Image processor 630 may be a general-purpose processor and/or one or more application-specific circuits that are dedicated to performing the features described herein. In one example, a general-purpose processor may be coupled to a memory to execute software instructions that cause the processor to perform certain processes described herein. In another embodiment, image processor 630 may be one or more circuits that are dedicated to performing certain features. While image processor 630 in FIG. 6 is shown as a stand-alone unit that is separate from controller 620 and drive circuit 644, image processor 630 may be a sub-unit of controller 620 or drive circuit 644 in other embodiments. In other words, in those embodiments, controller 620 or drive circuit 644 may perform various image processing functions of image processor 630. Image processor 630 may also be referred to as an image processing circuit.

In the example shown in FIG. 6, light source 642 may be driven by drive circuit 644, based on data or instructions (e.g., display and scanning instructions) sent from controller 620 or image processor 630. In one embodiment, drive circuit 644 may include a circuit panel that connects to and mechanically holds various light emitters of light source 642. Light source 642 may emit light in accordance with one or more illumination parameters that are set by the controller 620 and potentially adjusted by image processor 630 and drive circuit 644. The illumination parameters may be used by light source 642 to generate light. The illumination parameters may include, for example, source wavelength, pulse rate, pulse amplitude, beam type (continuous or pulsed), other parameter(s) that may affect the emitted light, or any combination thereof. In some embodiments, the source light generated by light source 642 may include multiple beams of red light, green light, and blue light, or any combination thereof.

Projector 650 may perform a set of optical functions, such as focusing, combining, conditioning, or scanning the image light generated by light source 642. In some embodiments, projector 650 may include a combining assembly, a light conditioning assembly, or a scanning mirror assembly. Projector 650 may include one or more optical components that optically adjust and potentially re-direct the light from light source 642. One example of the adjustment of light may include conditioning the light, such as expanding, collimating, correcting for one or more optical errors (e.g., field curvature, chromatic aberration, etc.), some other adjustments of the light, or any combination thereof. The optical components of projector 650 may include, for example, lenses, mirrors, apertures, gratings, polarizers, waveplates, prisms, or any combination thereof.

Human eyes can have a wide monocular FOV (e.g., about 170°-175° or wider) and wide total binocular FOV (e.g., about 200°-220° or wider). To provide more immersive experience to a user of an artificial reality system, such as an AR, VR, or MR system, the near-eye display system of the artificial reality system may need to provide a large FOV that may be close to the FOV of naked human eyes without using the artificial reality system. In addition, to improve the user experience, a higher resolution display system may be desired. It can be challenging to provide a near-eye display that can provide both a large FOV and a high resolution.

Figure 7:
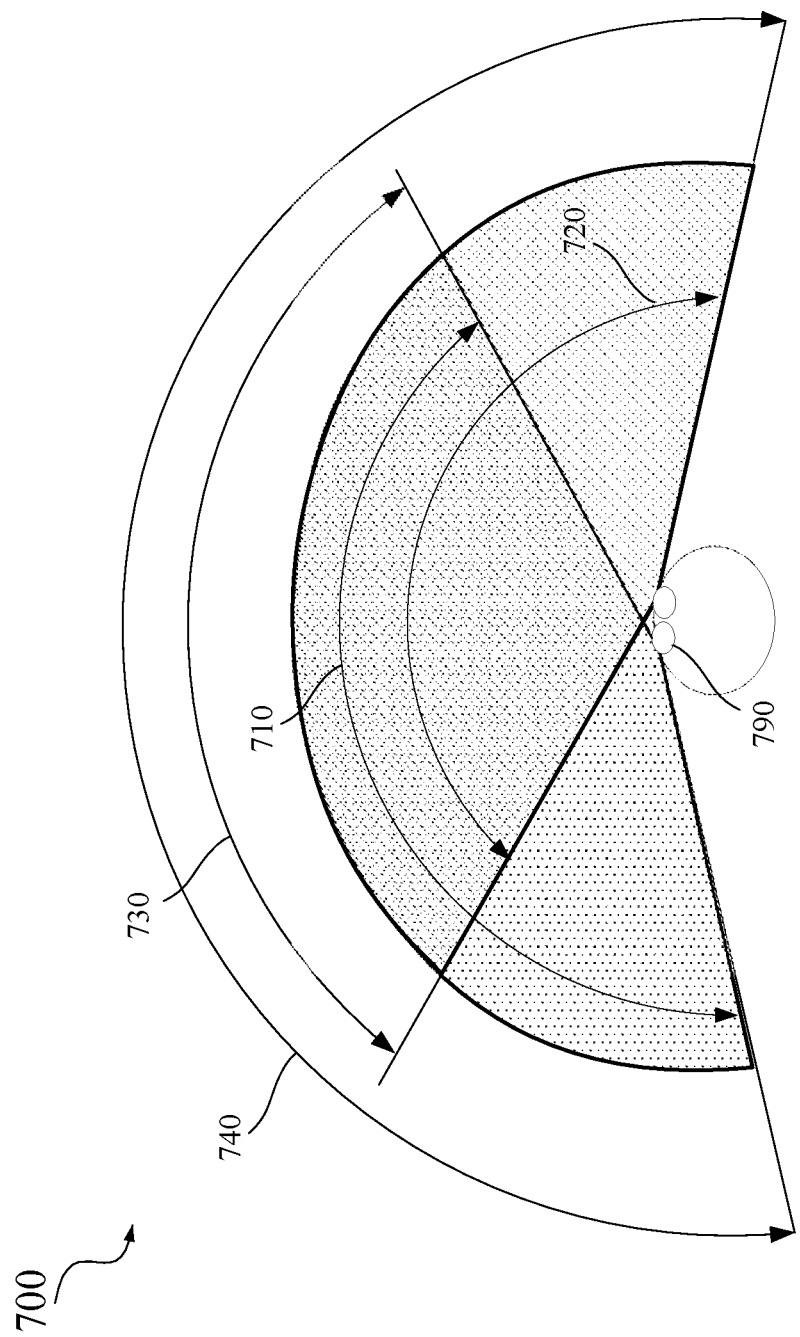
FIG. 7 illustrates examples of monocular and binocular fields of view of human eyes.

FIG. 7 includes a diagram 700 illustrating examples of monocular and binocular fields of view of human eyes 790. In FIG. 7, an angular range 710 shows the horizontal monocular FOV of a left eye of a person, and an angular range 720 shows the horizontal monocular FOV of a right eye of the person. Monocular FOV describes the field of view for one eye. For a healthy eye, the horizontal monocular FOV may be between about 170° and about 175°, which may include the nasal FOV (e.g., about 60°-65° from the pupil towards the nose) and the temporal FOV (e.g., about 100°-110° from the pupil towards the side of the head). FIG. 7 also shows a binocular FOV 740 of human eyes 790, which may be the combination of the two monocular fields of view in most humans, and may provide a total FOV of about 200°-220° or larger (e.g., up to) 240°. The overlapped range of the two monocular fields of view may be refer to as the stereoscopic binocular field of view 730, which may be about 114° to about 120°, objects within which may be perceived by the human eyes in three dimensions.

As described above, the FOV of a display system may be linearly proportional to the size of the image source (e.g., the display panel), and may be inversely proportional to the focal length of the display optics (e.g., a collimation lens or lens assembly). A balance between the size of the image source and the optical power of the display optics may be needed in order to achieve a good modulation transfer function (MTF) and reduced size/weight/cost. The field of view may be increased by bringing the image source closer, but the image source would need to have higher PPD, and the aberrations of the display optics at the periphery may limit the effective field of view. In addition, to achieve a high PPD, micro displays with ultra-high pixels per inch (PPI) may be needed. There may be many technological challenges and cost issues associated with making high-PPI display panels (e.g., silicon-based uOLED panels or micro-LED panels) with large sizes to cover wider FOVs. For example, micro displays may generally be small by design due to the uses of silicon backplanes that may have limited sizes and/or high cost for large sizes. As such, the FOVs of current AR/VR/MR systems may be limited, which may adversely affect the user experience.

Tiled displays that use two discrete display systems may be used to improve the FOV, where a central display system for the central FOV and a peripheral display system for the peripheral FOV may be placed, for example, side by side. However, tiled displays with discrete display systems may have many issues. One notable issue is the boundary between the central display system and the peripheral display system. For example, mechanical structures such as lens housing and eye-tracking assembly housing may create physical boundary between the discrete display systems of the tiled displays. In addition, the boundary between discrete display systems with mismatching resolutions can result in abrupt transitions across a displayed image.

According to certain embodiments, an integrated, tiled display system may include a peripheral display panel with a lower resolution on a first region of a large base substrate, and may also include a higher resolution central display panel bonded on top of a second region of the large base substrate that is adjacent to the first region. The large base substrate may include a rigid or flexible substrate, such as a glass or another oxide substrate (e.g., a metal oxide or semiconductor oxide), or an organic substrate, such as a polyimide substrate. The peripheral display panel may include, for example, a lower resolution panel (e.g., with PPI≤1K) that does not need to use a silicon backplane to drive. For example, the peripheral display panel may be controlled using thin-film transistor (TFT) drive circuits formed on the first region of the large base substrate. The lower resolution peripheral display panel may include, for example, an active matrix organic light-emitting diode (AMOLED) display panel or a liquid crystal display (LCD) panel. The central display panel may have a higher resolution (e.g., with PPI ≥4K or 5K), and may include, for example, micro-LEDs or μOLEDs with silicon-based backplane drive circuits. Thus, the tiled display system can have a higher resolution at least in the center (or foveated) region, and may also have a wider FOV provided by the combination of the central display panel and the peripheral display panel. For example, the monocular FOV of the tiled display system can be greater than 135°, 150°, 170° or wider, and the binocular FOV of a near-eye display including the tiled display system may be greater than abut 150°, 180°, 200°, 220°, or wider.

The central display panel with the higher resolution may have a small non-active edge region adjacent to the peripheral display panel. The small non-active edge region of the central display panel may be on top of and overlap with a non-active edge region of the peripheral display panel. Drive circuit of the peripheral display panel can be underneath the central display panel. Therefore, the non-active region between the two display panels of the tiled display system can be very small (e.g., less than 2 mm, 1 mm, 0.5 mm or smaller), such that the tiled display system may include a substantially continuous display panel with a higher resolution central region and a lower resolution peripheral region.

In some embodiments, at least the peripheral region of the base substrate and the lower resolution display panel formed thereon can be curved to further increase the FOV (e.g., greater than 180°, such as about) 200°-240°. Foveated rending may be utilized to create a smooth transition between the higher resolution central region and the lower resolution peripheral region. For example, in the boundary regions of the central display panel with the higher resolution, pixels in the central display panel may be grouped to form macro-pixels to gradually decrease the effective resolution from the higher resolution to the low resolution of the peripheral display panel. The display optics can include a single freeform (e.g., C-shaped) lens or dual lenses (e.g., one for each panel) optimized for both the central display panel and the peripheral display panel.

FIG. 8A is a perspective view of an example of a tiled display system 800 according to certain embodiments. In the illustrated example, tiled display system 800 may include a first display panel 810 superimposed on a portion of a second display panel 820. Second display panel 820 may include a substrate 822 that may be wider than, for example, 0.5", 1", 2", or larger. Substrate 822 may not be based on a semiconductor material, such as silicon, germanium, or a III-V semiconductor, but may instead include an oxide substrate (e.g., metal oxide or semiconductor oxide) or an organic substrate. For example, substrate 822 may include a glass substrate, a sapphire substrate, a ceramic substrate, a polyimide substrate, a polyethylene naphthalate (PEN) substrate, and the like. Substrate 822 may be rigid or may be flexible. In some embodiments, substrate 822 may include thin film transistor (TFT) drive circuits formed thereon. An active region 824 may be formed on a peripheral region of substrate 822. Active region 824 may include a display device that can be made to have a larger size (e.g., a few to tens of inches) but may have a lower resolution, such as with a PPI equal to or less than about 1K, and thus may not need to use silicon-based backplane drive circuits (which may have limited sizes) with small pixel drive circuit sizes. Active region 824 may include, for example, AMOLED, LCD, and the like, and may be driven by the TFT drive circuits formed on substrate 822. In one example, active region 824 may include an AMOLED display that includes an active matrix of OLED pixels configured to generate light upon electrical activation, where the OLED pixels may be deposited or integrated onto a TFT array, which may function as a series of switches to control the current flowing to each individual OLED pixel. In some embodiments, the TFT drive circuits may be fabricated in, for example, an indium-gallium-zinc-oxide (IGZO) layer, a polycrystalline silicon layer, or an amorphous silicon layer.

A region (e.g., the right region shown in FIG. 8A) of substrate 822 may not include light emitting devices, and first display panel 810 may be bonded on top of the region. First display panel 810 may include a substrate 812 and an active region 814 bonded to or otherwise formed on substrate 812. Substrate 812 may include, for example, a monocrystalline silicon substrate with drive circuits (e.g., complementary metal-oxide-semiconductor (CMOS) circuits) fabricated thereon. The CMOS drive circuits can have small feature sizes and high density, and thus can have small pixels and small pixel pitch, such as less than about 100 μm, 50 μm, 20 μm, 10 μm, 5 μm, 3 μm, 2 μm, or smaller. Active region 814 may include, for example, a two-dimensional array of micro-LEDs fabricated using III-V semiconductor materials, such as GaN, GaAs, GaP, INP, AlGaInP; or micro-OLED (uOLED) that includes organic light emitting diodes and color filters. The pixel size of active region 814 may match the pixel size of the CMOS drive circuits, and may be, for example, less than about 100 μm, 50 μm, 20 μm, 10 μm, 5 μm, 3 μm, 2 μm, or smaller. Active region 814 may have a limited size, but may have a very high resolution, such as with a PPI greater than about 4 K or 5K. Pixels of active region 814 may be bonded to and driven by the CMOS drive circuits in substrate 812. Some edge regions 816 of first display panel 810 may not include light emitting devices, but may include peripheral drive circuits (e.g., row or column drive circuits). As shown in FIG. 8A, first display panel 810 may have a very narrow non-active region 818 at the side adjacent to active region 824 of second display panel 820, such that the non-active region between active region 814 of first display panel 810 and active region 824 of second display panel 820 may be negligible when viewed in the z direction. For example, a width of non-active region 818 may be less than about 2 mm, less than about 1 mm, less than about 0.5 mm, or smaller.

FIG. 8B is a cross-sectional view of an example of tiled display system 800 according to certain embodiments. In the example shown in FIG. 8B, substrate 822 of second display panel 820 may be a flat substrate including a rigid material, such as a metal oxide or semiconductor oxide. First display panel 810 may be bonded on top of substrate 822 (e.g., using an adhesive). An optional first cover glass 830 with a thickness matching the thickness of first display panel 810 may be bonded on active region 824, such that the top surface of first cover glass 830 and the top surface of first display panel 810 may be on a same plane. In some embodiments, a second cover glass 840 may be formed on first cover glass 830 and first display panel 810 to protect first display panel 810.

Figure 9:
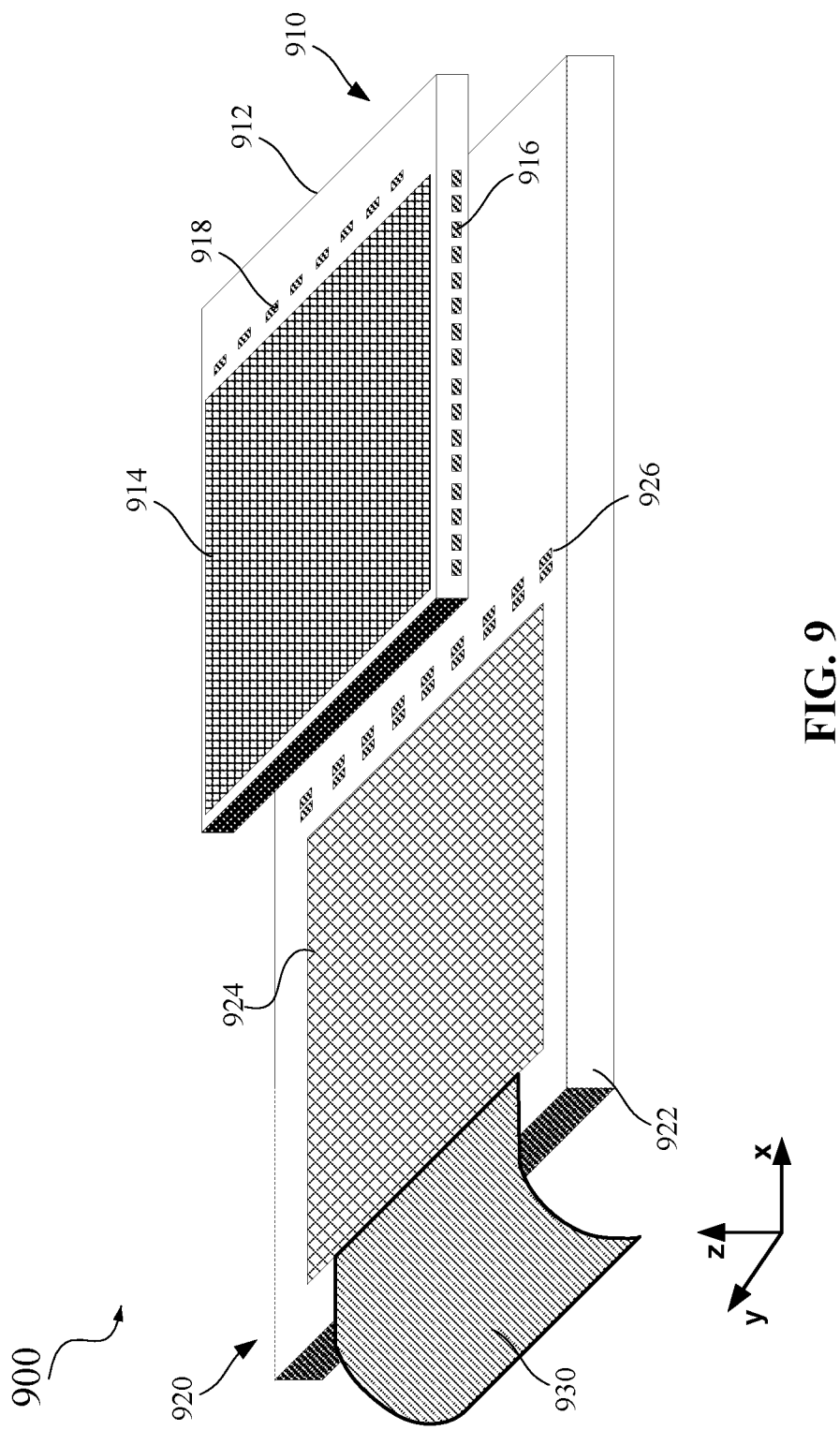
FIG. 9 is an exploded review of an example of a tiled display system according to certain embodiments.

FIG. 8C is a cross-sectional view of another example of tiled display system 800 according to certain embodiments. In the example shown in FIG. 8C, substrate 822 of second display panel 820 may include a flexible substrate, and may be curved in at least a peripheral region 826. For example, substrate 822 may include a flexible material, such as an organic material including polyimide, polyethylene naphthalate, or the like. Active region 824 (e.g., AMOLED) on the peripheral region 826 of substrate 822 may also be curved. Therefore, tiled display system 800 may be curved and may cover the sides of the user's face/eye, thereby providing an overall binocular FOV greater than 180°, such as about 200° to about 240°. FIG. 9 is an exploded view of an example of a tiled display system 900 according to certain embodiments. Tiled display system 900 may be an example of tiled display system 800. In the example shown in FIG. 9, tiled display system may include a first display panel 910 and a second display panel 920. First display panel 910 may be an example of first display panel 810, and second display panel 920 may be an example of second display panel 820. First display panel 910 may include a substrate 912 (e.g., a silicon substrate) with drive circuits 916 and 918 fabricated therein. For example, drive circuits 916 may include pixel drive circuits for providing the appropriate drive currents to individual pixels. Drive circuits 918 may include, for example, row selection circuits, column selection circuits, clock circuits, or other peripheral circuits. An active region 914 (e.g., including a two-dimensional array of micro-LEDs or μOLEDs) may be bonded to drive circuits 916 and 918 and substrate 912. Second display panel 920 may include an active region 924 (e.g., including AMOLED or LCD) formed in a region of a substrate 922 (e.g., including non-silicon or semiconductor substrate, such as an oxide or an organic substrate). FIG. 9 also shows drive circuits 926 (e.g., TFT circuits and routing circuits) formed on regions of substrate 922 that have no light sources formed thereon. At least some drive circuits 926 may be under first display panel 910 when first display panel 910 is bonded to substrate 922. A flexible ribbon cable 930 may be used to provide power and image data to second display panel 920 and/or first display panel 910.

Figure 10:
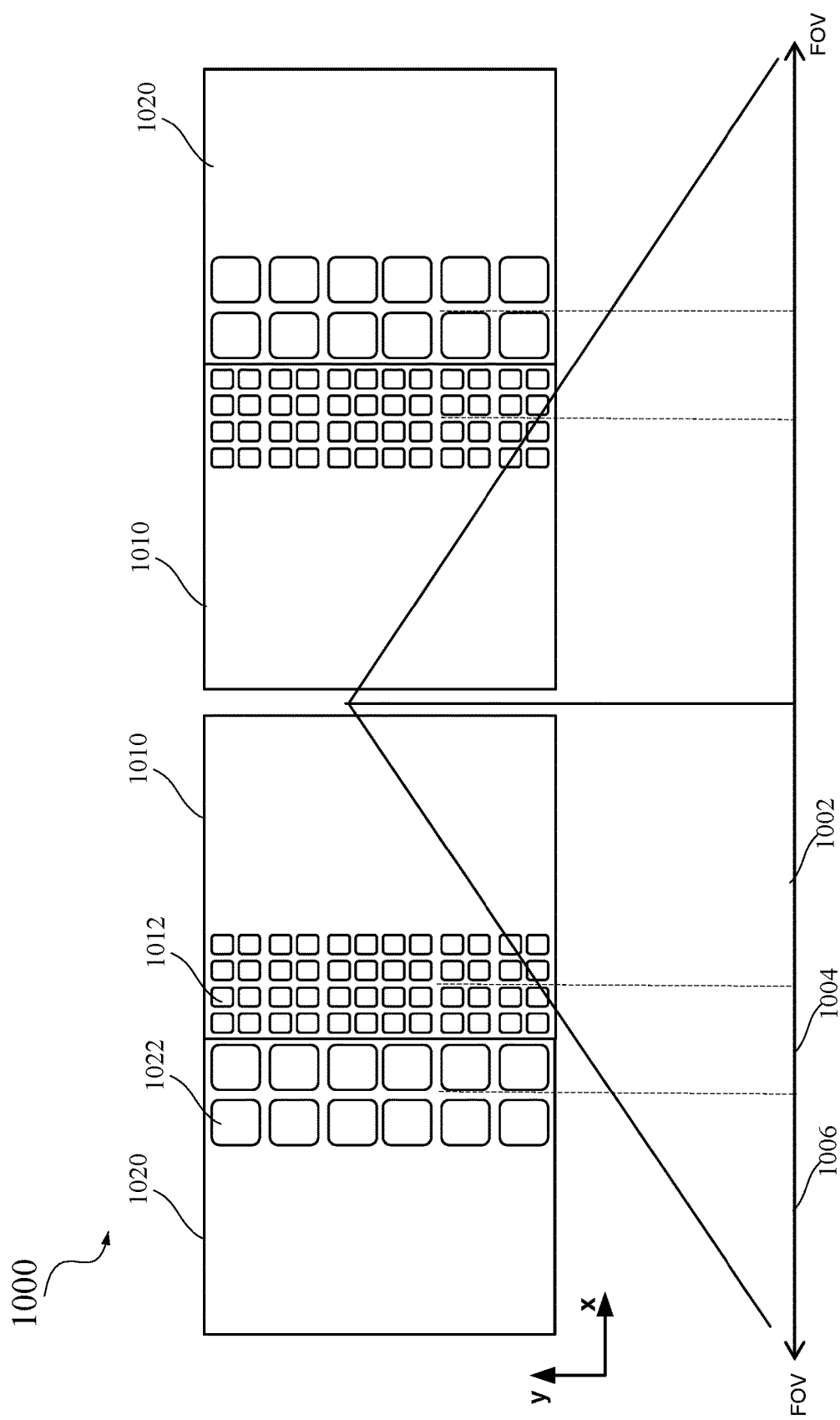
FIG. 10 illustrates an example of resolution transition between a high-resolution panel and a low-resolution panel in a tiled display system of a near-eye display according to certain embodiments.

FIG. 10 illustrates an example of resolution transition between a higher resolution panel and a lower resolution panel in a near-eye display system 1000 according to certain embodiments. FIG. 10 show two tiled display systems for two eyes of a user of near-eye display system 1000, where each of the two tilted display systems may include a first display panel 1010 having a higher resolution and a second display panel 1020 having a lower resolution. First display panel 1010 and second display panel 1020 may be integrated onto a same large base substrate as described above with respect to FIGS. 8A-9. FIG. 10 shows pixels 1012 of first display panel 1010 and pixels 1022 of second display panel 1020. In a center region 1002 (or a foveated region) of near-eye display system 1000, the display resolution may be high (e.g., with a PPI ≥4 K or 5K), since the user's eye may be more sensitive for the foveated region. In a peripheral region 1006, the display resolution can be lower since the user's eye may not be very sensitive to the peripheral region. In a transition region 1004, the display resolution can be gradually changed from the higher resolution to the lower resolution. For example, multiple pixels of first display panel 1010 may be grouped into a macro-pixel and driven using the same pixel data to effectively function as a single pixel. More and more pixels may be included in each macro-pixel to form larger and larger effective pixels as the FOV angle increases. For example, the macro-pixels may each include 2 pixels, 3 pixels, 4 pixels, 6 pixels, 8 pixels, and the like to reduce the resolution by a factor of 2, 3, 4, 6, 8, and the like. As such, there may not be sharp changes in the display resolution to cause noticeable transition region in the display region for a single eye.

Figure 11:
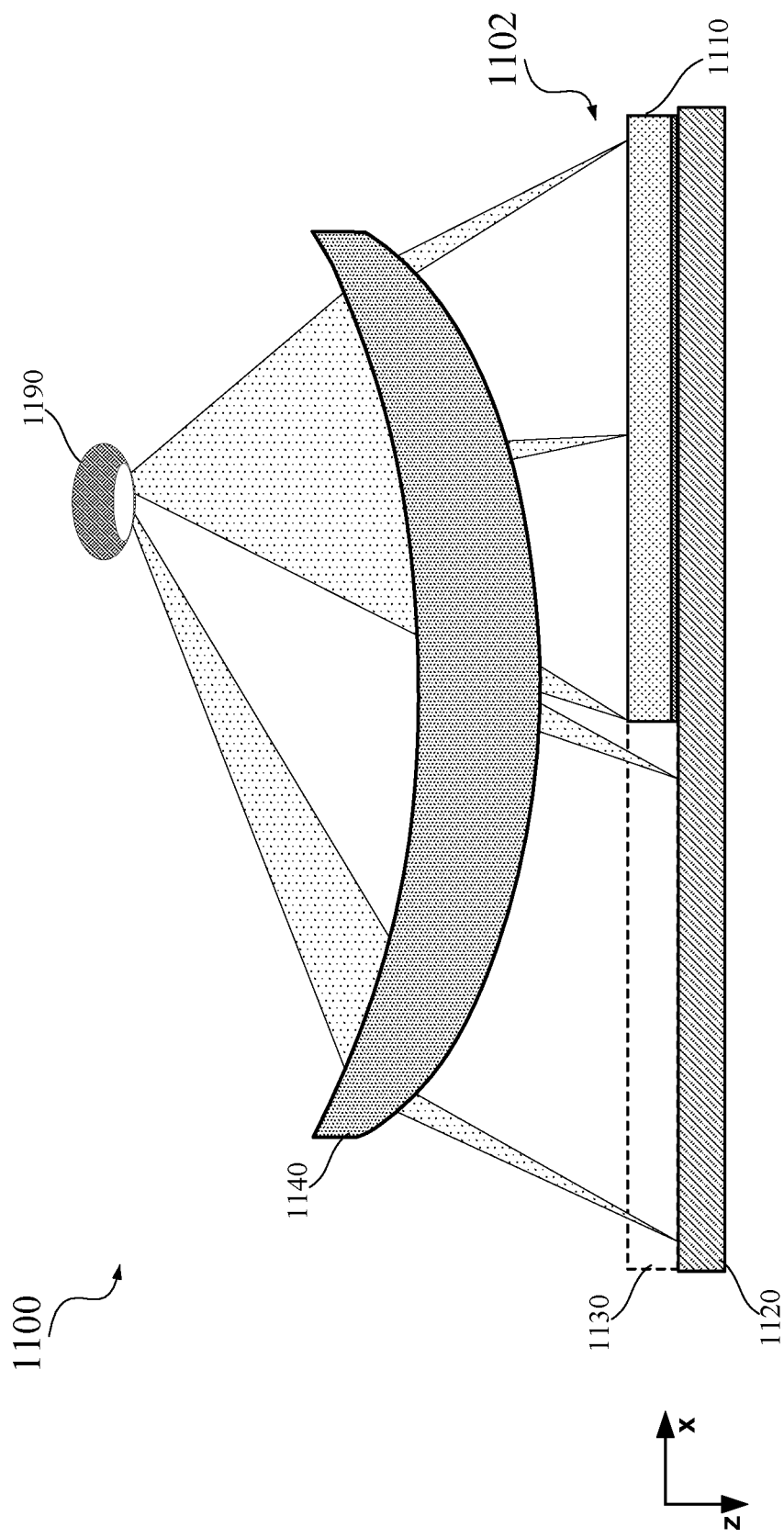
FIG. 11 illustrates an example of a near-eye display system including a tiled display system and display optics according to certain embodiments.

FIG. 11 illustrates an example of a near-eye display system 1100 including a tiled display system 1102 and display optics 1140 according to certain embodiments. FIG. 11 only shows a half of near-eye display system 1100 for one eye of a user. A similar structure may be in the other half of near-eye display system 1100 for another eye of the user. Tiled display system 1102 may be similar to the tiled display systems described above with respect to FIGS. 8A-10, and may include, for example, a display panel 1110 with a higher resolution and a display panel 1120 with a lower resolution that are integrated on a same substrate. In the illustrated example, an optional cover glass 1130 may be placed on display panel 1120. The thickness of cover glass 1130 may be about the same as the thickness of display panel 1110. Even though not shown in FIG. 11, tiled display system 1102 may include another cover glass on display panel 1110 and cover glass 1130 to protect display panel 1110.

Display optics 1140 may include a single lens, a lens assembly, or two or more lenses or lens assemblies. In some embodiments, display optics 1140 may include a freeform lens that may include aspherical surfaces. In some embodiments, display optics 1140 may include a lens assembly that forms a folded lens, such as a pancake lens. In one example, display optics 1140 may include a meniscus (C-shaped) pancake lens that can provide a binocular FOV up to, for example, 220°, or a monocular FOV up to, for example, 175°, to user's eyes 1190. In some embodiments, display optics 1140 may include a flat lens, such as a Fresnel lens, a Pancharatnam berry phase (PBP) lens, or a metasurface lens that can have different optical performance (e.g., focal length or optical power) at different regions. In some embodiments, display optics 1140 may include two lenses each optimized for one of display panel 1110 and display panel 1120.

Figure 12:
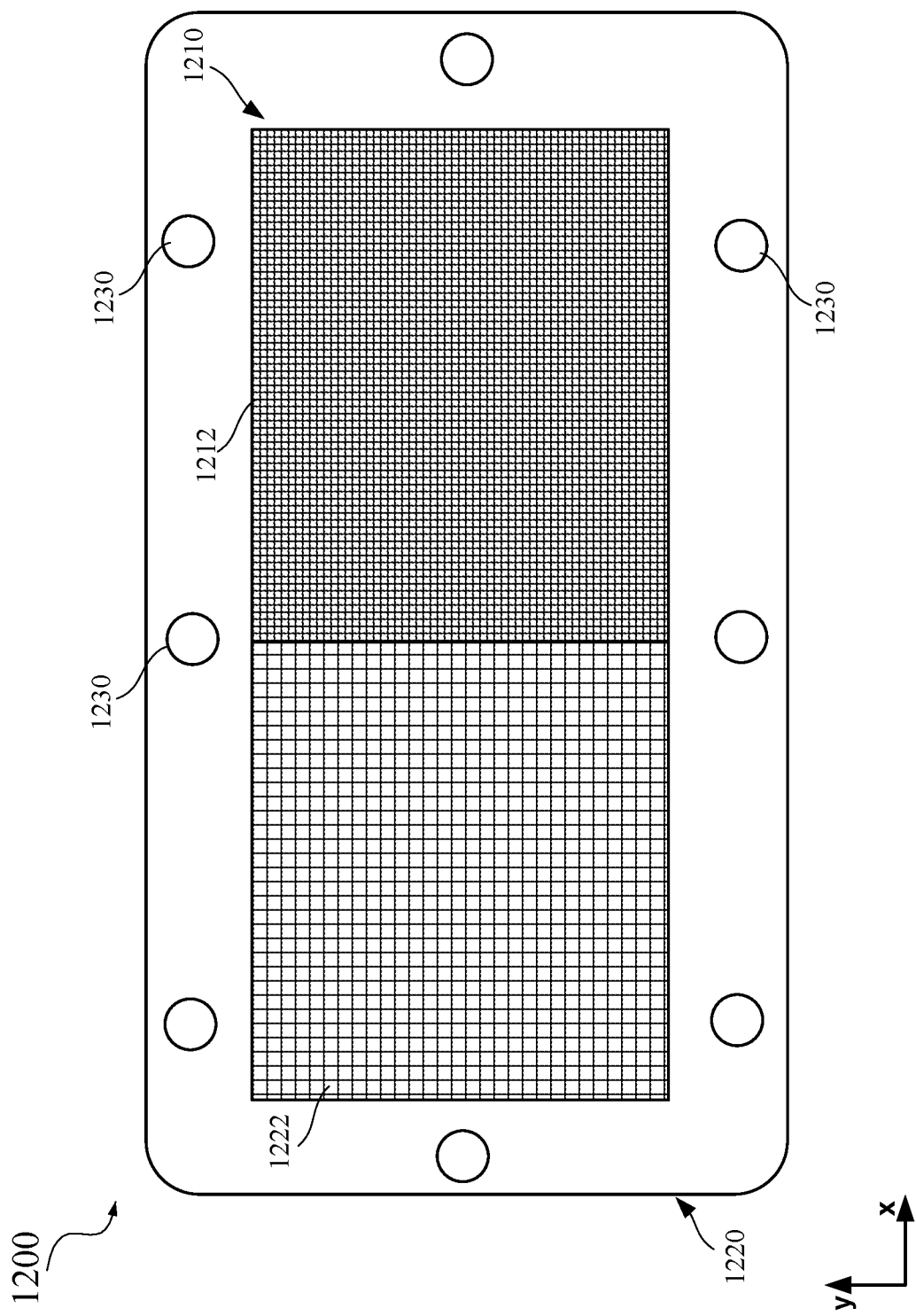
FIG. 12 illustrates an example of a tiled display system including eye tracking devices according to certain embodiments.

FIG. 12 illustrates an example of a tiled display system 1200 including eye-tracking devices 1230 according to certain embodiments. Tiled display system 1200 may include a large substrate 1220 (e.g., a glass substrate or another oxide substrate, or an organic substrate such as a polyimide substrate). A first display panel 1210 that includes an active region 1212 (e.g., including a 2-D array of micro-LEDs or μOLEDs) formed on a silicon backplane may be bonded to substrate 1220. Active region 1212 may have a higher resolution (e.g., with a PPI ≥4 K or 5K). An active region 1222 (e.g., including AMOLED or LCD) may be formed on a peripheral region of substrate 1220. In addition, eye-tracking devices 1230, such as infrared light emitters and/or infrared sensors, may be formed on or embedded in edge regions of substrate 1220 surrounding active regions 1212 and 1222. Eye-tracking devices 1230 may be in front of the user's eye, and thus may be able to capture images of the user's eye directly from favorable angles to provide more accurate eye-tracking performance. Eye-tracking devices 1230 may be arranged according to a pattern, such as a pattern having a circular shape, a rectangular shape, an oval shape, and the like. Eye-tracking devices 1230 may not be positioned between active regions 1212 and 1222, such that the non-active gap between active regions 1212 and 1222 can be small, such as less than about 2 mm, less than about 1 mm, less than about 0.5 mm, or smaller. Based on the eye tracking, the foveated region may be changed, and the display resolution at different regions can be changed accordingly.

Even though FIGS. 8A-12 show examples of tiled display systems that may expand the FOV in a horizonal plane, in some of the tiled display systems described above, lower resolution display panels may additionally or alternatively be positioned on top of and/or below the higher resolution display panel to additionally or alternatively expand the FOV in a vertical plane. In some embodiments, two or more lower resolution display panels may be positioned on a same side of the higher resolution display panel. For example, an active region with a medium resolution may be placed adjacent to the higher resolution display panel, and an active region with a lower resolution may be placed adjacent to the active region with the medium resolution on the large base substrate. In some embodiments, a tiled display system may include two or more higher resolution display panels bonded to a same base substrate, and may or may not include a lower resolution active region formed on the base substrate.

Figure 13:
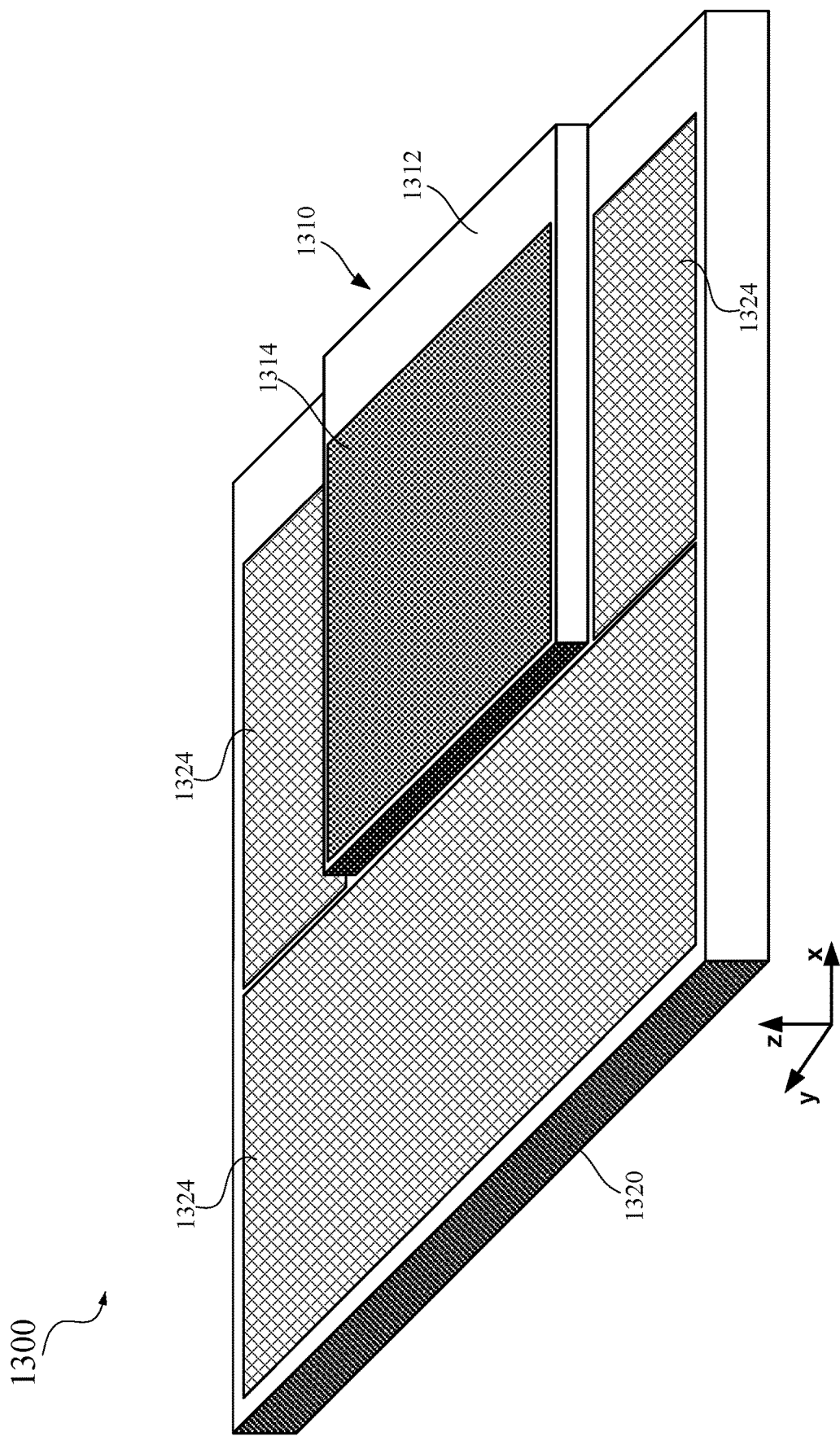
FIG. 13 illustrates an example of a tiled display system including multiple low-resolution active regions at the periphery of a high-resolution display panel according to certain embodiments.

FIG. 13 illustrates another example of a tiled display system 1300 including multiple lower resolution active regions 1324 at the periphery of a higher resolution display panel 1310 according to certain embodiments. In the illustrated example, tiled display system 1300 may include a substrate 1320 with an extended area (e.g., up to about a few inches), and may include a plurality of active regions 1324 that may include display devices that may not use silicon-based drive circuits, such as AMOLED or LCD display devices formed on TFT drive circuits. A region of substrate 1320 may not include active regions 1324 formed thereon, and may or may not include drive circuits for active regions 1324 formed thereon. Higher resolution display panel 1310 may be bonded on the region of substrate 1320 that does not have active regions formed thereon. As described above, higher resolution display panel 1310 may include an active region 1314 that may include, for example, micro-LEDs or OLEDs, and silicon-based drive circuits fabricated on a silicon substrate 1312 using CMOS processes, and thus can have small pixel drive circuits and can achieve small pixel sizes/pitches for higher resolution. As shown in FIG. 13, active regions 1324 may be to the left or right of active region 1314 in the x direction, and/or may be above and/or below active regions 1314 in the y direction, and thus may increase the horizontal FOV and/or vertical FOV of tiled display system 1300.

Embodiments disclosed herein may be used to implement components of an artificial reality system or may be implemented in conjunction with an artificial reality system. Artificial reality is a form of reality that has been adjusted in some manner before presentation to a user, which may include, for example, a virtual reality, an augmented reality, a mixed reality, a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including an HMD connected to a host computer system, a standalone HMD, a mobile device or computing system, or any other hardware platform capable of providing artificial reality content to one or more viewers.

Figure 14:
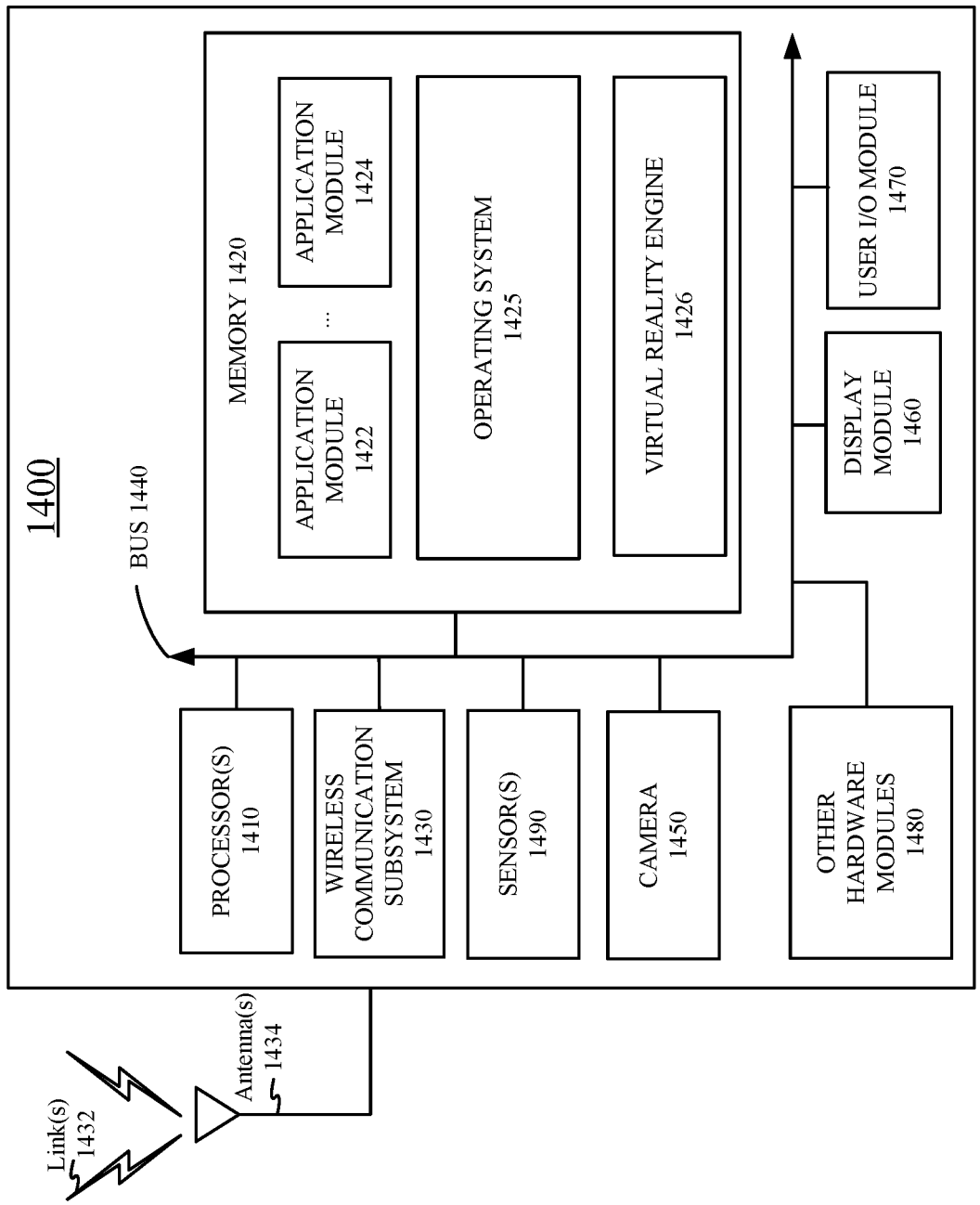
FIG. 14 is a simplified block diagram of an example of an electronic system of a near-eye display for implementing some of the examples disclosed herein.

FIG. 14 is a simplified block diagram of an example of an electronic system 1400 of a near-eye display (e.g., HMD device) for implementing some of the examples disclosed herein. Electronic system 1400 may be used as the electronic system of an HMD device or other near-eye displays described above. In this example, electronic system 1400 may include one or more processor(s) 1410 and a memory 1420. Processor(s) 1410 may be configured to execute instructions for performing operations at a number of components, and can be, for example, a general-purpose processor or microprocessor suitable for implementation within a portable electronic device. Processor(s) 1410 may be communicatively coupled with a plurality of components within electronic system 1400. To realize this communicative coupling, processor(s) 1410 may communicate with the other illustrated components across a bus 1440. Bus 1440 may be any subsystem adapted to transfer data within electronic system 1400. Bus 1440 may include a plurality of computer buses and additional circuitry to transfer data.

Memory 1420 may be coupled to processor(s) 1410. In some embodiments, memory 1420 may offer both short-term and long-term storage and may be divided into several units. Memory 1420 may be volatile, such as static random access memory (SRAM) and/or dynamic random access memory (DRAM) and/or non-volatile, such as read-only memory (ROM), flash memory, and the like. Furthermore, memory 1420 may include removable storage devices, such as secure digital (SD) cards. Memory 1420 may provide storage of computer-readable instructions, data structures, program modules, and other data for electronic system 1400.

In some embodiments, memory 1420 may store a plurality of application modules 1422 through 1424, which may include any number of applications. Examples of applications may include gaming applications, conferencing applications, video playback applications, or other suitable applications. The applications may include a depth sensing function or eye tracking function. Application modules 1422-1424 may include particular instructions to be executed by processor(s) 1410. In some embodiments, certain applications or parts of application modules 1422-1424 may be executable by other hardware modules 1480. In certain embodiments, memory 1420 may additionally include secure memory, which may include additional security controls to prevent copying or other unauthorized access to secure information.

In some embodiments, memory 1420 may include an operating system 1425 loaded therein. Operating system 1425 may be operable to initiate the execution of the instructions provided by application modules 1422-1424 and/or manage other hardware modules 1480 as well as interfaces with a wireless communication subsystem 1430 which may include one or more wireless transceivers. Operating system 1425 may be adapted to perform other operations across the components of electronic system 1400 including threading, resource management, data storage control and other similar functionality.

Wireless communication subsystem 1430 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 1400 may include one or more antennas 1434 for wireless communication as part of wireless communication subsystem 1430 or as a separate component coupled to any portion of the system. Depending on desired functionality, wireless communication subsystem 1430 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 1430 may permit data to be exchanged with a network, other computer systems, and/or any other devices described herein. Wireless communication subsystem 1430 may include a means for transmitting or receiving data, such as identifiers of HMD devices, position data, a geographic map, a heat map, photos, or videos, using antenna(s) 1434 and wireless link(s) 1432.

Embodiments of electronic system 1400 may also include one or more sensors 1490. Sensor(s) 1490 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor.

Electronic system 1400 may include a display module 1460. Display module 1460 may be a near-eye display, and may graphically present information, such as images, videos, and various instructions, from electronic system 1400 to a user. Such information may be derived from one or more application modules 1422-1424, virtual reality engine 1426, one or more other hardware modules 1480, a combination thereof, or any other suitable means for resolving graphical content for the user (e.g., by operating system 1425). Display module 1460 may use LCD technology, LED technology (including, for example, OLED, ILED, μ-LED, AMOLED, TOLED, etc.), light emitting polymer display (LPD) technology, or some other display technology.

Electronic system 1400 may include a user input/output module 1470. User input/output module 1470 may allow a user to send action requests to electronic system 1400. An action request may be a request to perform a particular action. For example, an action request may be to start or end an application or to perform a particular action within the application. User input/output module 1470 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 1400. In some embodiments, user input/output module 1470 may provide haptic feedback to the user in accordance with instructions received from electronic system 1400. For example, the haptic feedback may be provided when an action request is received or has been performed.

Electronic system 1400 may include a camera 1450 that may be used to take photos or videos of a user, for example, for tracking the user's eye position. Camera 1450 may also be used to take photos or videos of the environment, for example, for VR, AR, or MR applications. Camera 1450 may include, for example, a complementary metal-oxide-semiconductor (CMOS) image sensor with a few millions or tens of millions of pixels. In some implementations, camera 1450 may include two or more cameras that may be used to capture 3-D images.

In some embodiments, electronic system 1400 may include a plurality of other hardware modules 1480. Each of other hardware modules 1480 may be a physical module within electronic system 1400. While each of other hardware modules 1480 may be permanently configured as a structure, some of other hardware modules 1480 may be temporarily configured to perform specific functions or temporarily activated. Examples of other hardware modules 1480 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 1480 may be implemented in software.

In some embodiments, memory 1420 of electronic system 1400 may also store a virtual reality engine 1426. Virtual reality engine 1426 may execute applications within electronic system 1400 and receive position information, acceleration information, velocity information, predicted future positions, or any combination thereof of the HMD device from the various sensors. In some embodiments, the information received by virtual reality engine 1426 may be used for producing a signal (e.g., display instructions) to display module 1460. For example, if the received information indicates that the user has looked to the left, virtual reality engine 1426 may generate content for the HMD device that mirrors the user's movement in a virtual environment. Additionally, virtual reality engine 1426 may perform an action within an application in response to an action request received from user input/output module 1470 and provide feedback to the user. The provided feedback may be visual, audible, or haptic feedback. In some implementations, processor(s) 1410 may include one or more GPUs that may execute virtual reality engine 1426.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms "and" and "or," as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics.

However, it should be noted that this is merely an illustrative example and claimed subject matter is not limited to this example. Furthermore, the term "at least one of" if used to associate a list, such as A, B, or C, can be interpreted to mean A, B, C, or any combination of A, B, and/or C, such as AB, AC, BC, AA, ABC, AAB, AABBCCC, or the like.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A display panel comprising:
a first substrate including a first region and a second region adjacent to the first region;
a first active region on the first region of the first substrate and characterized by a first display resolution;
a silicon backplane bonded on the second region of the first substrate; and
a second active region on the silicon backplane, the second active region characterized by a second display resolution higher than the first display resolution.

2. The display panel of claim 1, wherein the first substrate includes a rigid substrate.

3. The display panel of claim 2, wherein the rigid substrate includes a metal oxide or a semiconductor oxide.

4. The display panel of claim 1, wherein:
the first substrate includes a flexible organic substrate and is curved at least at the first region; and
the first active region is curved to further increase a field of view of the display panel.

5. The display panel of claim 1, wherein the first active region includes an active matrix organic light-emitting diode (AMOLED) display panel or a liquid crystal display (LCD) panel.

6. The display panel of claim 1, further comprising a thin-film transistor (TFT) layer between the first substrate and the first active region.

7. The display panel of claim 1, further comprising drive circuits for the first active region formed on the second region of the first substrate and between the silicon backplane and the first substrate.

8. The display panel of claim 1, further comprising a cover glass on the first active region, the cover glass having a thickness matching a total thickness of the silicon backplane and the second active region.

9. The display panel of claim 1, wherein the second active region includes a two-dimensional array of micro-light emitting diodes (micro-LEDs) or a two-dimensional array of micro organic light emitting diodes (µOLEDs).

10. The display panel of claim 3, wherein the second display resolution is equal to or greater than 4 K pixels per inch.

11. The display panel of claim 1, wherein:
the silicon backplane includes complementary metal-oxide-semiconductor (CMOS) pixel drive circuits for the second active region; and
the pixel drive circuits are characterized by a pitch less than 50 µm.

12. The display panel of claim 1, wherein a gap between the first active region and the second active region is less than 1 mm.

13. The display panel of claim 1, wherein a region of the second active region adjacent to the first active region includes macro-pixels, each macro-pixel including a group of pixels that are configured to receive the same display data.

14. The display panel of claim 13, wherein a number of pixels in each macro-pixel gradually increases as a distance between the macro-pixel and the first active region decreases.

15. The display panel of claim 1, further comprising a plurality of eye-tracking devices formed on or in edge regions of the first substrate that are outside of the first region and the second region.

16. The display panel of claim 15, wherein the plurality of eye-tracking devices includes infrared light emitters, infrared sensors, or both infrared light emitters and infrared sensors.

17. The display panel of claim 1, wherein a total monocular field of view of the display panel is greater than 150°.

18. A near-eye display system comprising:
a display panel including:
a first substrate including a first region and a second region adjacent to the first region;
a first active region on the first region of the first substrate and characterized by a first display resolution;
a silicon backplane bonded on the second region of the first substrate; and
a second active region on the silicon backplane, the second active region characterized by a second display resolution greater than the first display resolution; and a display optics configured to project images displayed by the display panel to an eye of a user.

19. The near-eye display system of claim 18, wherein the display optics include a C-shaped pancake lens.

20. The near-eye display system of claim 18, wherein a monocular field of view of the near-eye display system is greater than 150°.

\* \* \* \* \*